United States Patent [19]

Spires

[11] Patent Number: 4,477,780

[45] Date of Patent: Oct. 16, 1984

[54] OPERATIONAL AMPLIFIER WITH MULTIPLE SWITCHABLE OUTPUTS

[75] Inventor: Dewayne A. Spires, Plaistow, N.H.

[73] Assignee: AT&T Bell Laboratories, Murray Hill, N.J.

[21] Appl. No.: 437,110

[22] Filed: Oct. 27, 1982

[51] Int. Cl.³ .......................... H03F 3/26; H03F 1/34; H03G 3/18

[52] U.S. Cl. .................................... 330/265; 330/291; 330/278

[58] Field of Search .................... 330/81, 83, 103, 265, 330/271, 278, 291

[56] References Cited

U.S. PATENT DOCUMENTS 4,376,267  3/1983  Chu et al. ............................ 330/278

OTHER PUBLICATIONS

"Operational Amplifiers–Design and Applications", ed. by J. G. Greene et al., McGraw-Hill Book Do., 1971, pp. 236-255.

Primary Examiner—James B. Mullins
Assistant Examiner—G. Wan
Attorney, Agent, or Firm—John K. Mullarney

[57] ABSTRACT

The disclosed operational amplifier comprises a first pair of complementary type transistors that have their emitter-collector paths connected in series across a source of reference potential. The emitters of the transistors are connected together and to an output terminal. A feedback resistance is coupled from the output terminal to the amplifier input. A second pair of complementary type transistors are similarly connected across said reference potential, with the emitters thereof connected together and to a second output terminal. A second feedback resistance is coupled from the second output to the amplifier input. A pair of resistors of predetermined values are respectively connected between the base electrodes of similar type transistors of the first and second transistor pairs. And a pair of constant current sources are respectively coupled to the base electrodes of the second pair of transistors. The second pair of transistors are reversed biased until the output voltage from the first pair of transistors equals or exceeds the voltage drop across at least one of the base coupled resistors, at which time the second feedback resistance is effectively switched in shunt with the first-mentioned feedback resistance. Additional switched outputs are readily obtained with little additional circuitry.

7 Claims, 2 Drawing Figures

OPERATIONAL AMPLIFIER WITH MULTIPLE SWITCHABLE OUTPUTS

Technical Field

The present invention relates to an operational amplifier that switches gain when its output reaches a predetermined voltage or voltages.

Background of the Invention

The traditional method of providing switchable gain in operational amplifier circuits is to provide one or more feedback resistors in series with one or more diodes or zener diodes; see the publication by J. G. Graeme et al. entitled "Operational Amplifiers—Design and Applications" McGraw-Hill Book Co. (1971), pp. 236–255. The gain of the amplifier (in the inverting configuration) is the feedback resistance (of the amplifier) divided by the source resistance until the diode(s) threshold is reached by the output voltage. The diode(s) then switches in the feedback resistor(s) in series with it and the gain is altered accordingly. Multiple gains are provided by having multiple diodes in multiple series paths with multiple feedback resistors. The disadvantage of this approach is twofold. First, the voltage at which the gain switches is not very stable. Diode voltages are not well controlled and vary with temperature. Second, the voltage at which the gain switches is not easily adjusted. For example, diodes cannot be selected in 0.1 volt increments, and significant circuitry must be added if fine resolution of the switching voltage is required.

Summary of the Invention

An operational amplifier in accordance with the present invention comprises a first pair of complementary type transistors that have their emitter-collector paths connected in series across a source of reference potential. The emitters of the transistors are connected together and to an output terminal. A feedback resistance is coupled from the output terminal to the amplifier input. A second pair of complementary type transistors are similarly connected across said reference potential, with the emitters thereof connected together and to a second output terminal. A second feedback resistance is coupled from this second output to the amplifier input. A pair of resistors of predetermined values are respectively connected between the base electrodes of similar type transistors of the first and second transistor pairs. And a pair of constant current sources are respectively coupled to the base electrodes of the second pair of transistors. The second pair of transistors are reversed biased until the output voltage from the first pair of transistors equals or exceeds the voltage drop across at least one of the base coupled resistors at which time the second feedback resistance effectively shunts the first-mentioned feedback resistance.

Brief Description of the Drawing

The invention will be more fully appreciated from the following detailed description when the same is considered in connection with the accompanying drawings, in which.

Detailed Description

Figure 1:
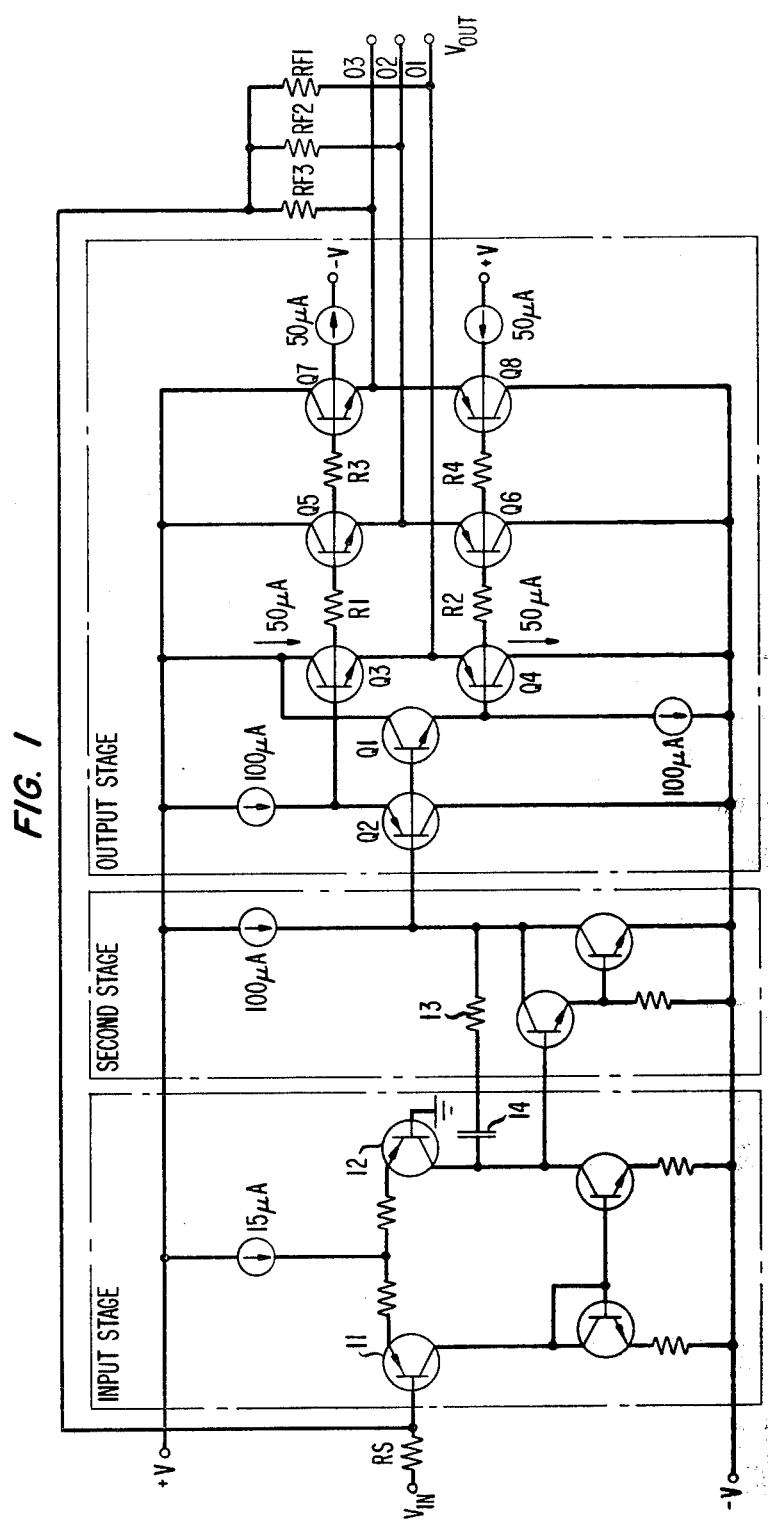
FIG. 1 is a schematic circuit diagram of an operational amplifier in accordance with the present invention.

Referring now to FIG. 1 of the drawings, an operational amplifier, in accordance with the invention, incorporates an input stage and a second stage that are more or less conventional in design. The differential input stage is used for power supply rejection. The input signal ($V_{in}$) is coupled to the base of transistor 11 via source resistance (RS), while the base of transistor 12 is grounded. The output of this stage is coupled to the second stage which comprises a pair of transistors interconnected in a Darlington configuration to provide good current gain. A negative feedback path comprising resistance 13 and capacitance 14 provides added circuit stability. The output stage, designed in accordance with the invention, contains the circuitry for switching gains. The first output (01) is derived from a cross-coupled stage which is comprised of transistors Q1, Q2, Q3 and Q4. This output determines the initial gain (RF1/RS) of the circuit. A constant current source (e.g., 100µA) is connected in each of the emitter paths of transistors Q1 and Q2, which are connected as emitter followers for buffering purposes. The signal at the emitter of transistor Q1 is coupled to the base of transistor Q4, and the signal at the emitter of transistor Q2 is delivered to the base of transistor Q3. The transistors Q3 and Q4 are complementary type transistors (i.e., of opposite conductivity), with their emitter-collector paths connected in series across a source of reference potential ($+V, -V$). The emitters of transistors Q3 and Q4 are connected to each other and to an output terminal (01). The feedback resistance RF1 is connected from this output (01) to the input of the amplifier. Accordingly, as will be obvious to those in the art, when either or both of the transistors Q3 and Q4 are conducting the gain of the amplifier is $-_{RS}{}^{RF1}$. The minus sign is indicative of the fact that the circuit of FIG. 1 comprises an inverting amplifier. A 50µA quiescent current flows in the emitter-collector paths of transistors Q3 and Q4.

A second pair of complementary type transistors Q5 and Q6 are connected across the source of reference potential ($+V, -V$) in the very same manner as transistors Q3 and Q4. The emitters of transistors Q5 and Q6 are connected to each other and to a second output terminal (02). The feedback resistance RF2 is connected from this second output to the input of the amplifier. The bases of transistors Q3 and Q5 are connected through resistance R1 and thence through resistance R3 (to be described hereinafter) to a constant current source (e.g., 50µA) and reference potential $-V$. Similarly, the bases of transistors Q4 and Q6 are connected through resistance R2 and thence through resistance R4 (to be described) to another 50µA constant current source and reference potential $+V$.

The transistors Q5 and Q6 provide the first switchable output. This output effectively switches feedback resistance RF2 in parallel with RF1 when the 01 output reaches a positive voltage ($V_1$) of R1 times 50µA or a negative voltage ($V_2$) of R2 times 50µA.

If the positive voltage at output terminal 01 is designated $V_{01}$, then the voltage at the base of Q3 is $V_{01} + V_{be}$, the $V_{be}$ being the voltage drop across the base-emitter junction. Accordingly, the voltage at the base of Q5 is $(V_{01} + V_{be}) - V_1$, where $V_1 = R1 \cdot 50\mu A$. When the output voltage $V_{01}$ equals $V_1$ the transistor Q5 conducts because its $V_{be}$ is the same as the $V_{be}$ of conducting transistor Q3. The conduction of Q5 in effect places the feedback resistance RF2 in shunt with feedback resistance RF1.

Similarly, when the negative voltage at output terminal 01 equals $V_2$ (where $V_2 = R2 \cdot 50\mu A$) the transistor Q6 conducts because its $V_{be}$ is the same as the $V_{be}$ of transistor Q4. This also effectively places the feedback resistance RF2 in shunt with RF1.

The voltages $V_1$ and $V_2$ do not necessarily have to be equal, and they are easily adjusted to any value by choosing appropriate values of R1 and R2. It is important to note that the $V_{be}$'s of Q5 and Q6 do not effect the switching threshold because they are matched to Q3 and Q4, respectively. This removes the $V_{be}$ uncertainty and temperature variation of Q5 and Q6 from the threshold voltage. Hence, both of the deficiencies associated with the conventional design are overcome.

Additional switchable outputs like 03 are easily obtained with little additional circuitry. To this end, a third pair of complementary type transistors Q7 and Q8 are connected across the source of reference potential in the same manner as the previous pairs of transistors Q3/Q4 and Q5/Q6. The emitters of transistors Q7 and Q8 are connected to each other and to the third output terminal (Q3). The feedback resistance RF3 is connected from this third output to the amplifier input. The bases of transistors Q5 and Q7 are connected through resistance R3, with the bases of Q7 connected directly to the $50\mu A$ constant current source. Similarly, the bases of transistors Q6 and Q8 are connected through resistance R4, with the base of Q8 connected directly to the other $50\mu A$ constant current source.

The transistors Q7 and Q8 provide the second switchable output. This output effectively switches feedback resistance RF3 in parallel with RF1 and RF2 when the 01 output reaches a positive voltage ($V_3$) of (R1+R3) times $50\mu A$ or a negative voltage ($V_4$) of (R2+R4) times $50\mu A$) that is, $V_3 = (R1+R3) \cdot 50\mu A$ and $V_4 = (R2+R4) \cdot 50\mu A$. Hence again, the voltages $V_3$ and $V_4$ do not necessarily have to be equal, and they are easily adjusted to any value by choosing appropriate values of R3 and R4. Also, like transistors Q5 and Q6, the transistors Q7 and Q8 are chosen to match closely the transistors Q3 and Q4 so that the $V_{be}$'s are essentially the same for all these transistors.

Figure 2:
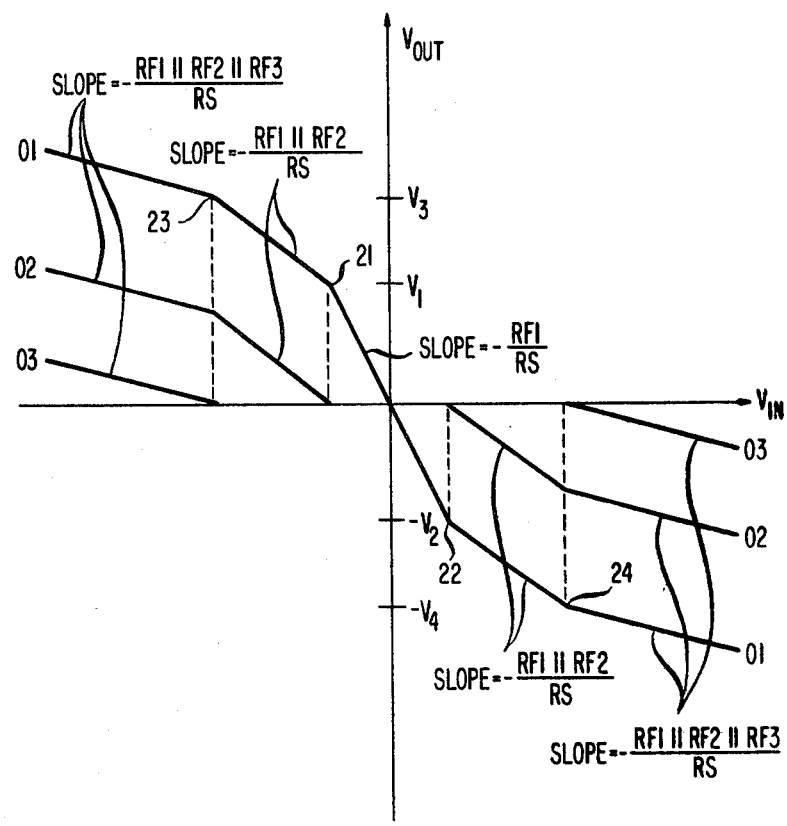
FIG. 2 shows transfer curves which illustrate the operation of the FIG. 1 circuit.

FIG. 2 shows the transfer curves for the three outputs 01, 02 and 03. Looking first at the 01 curve, the slope, which is indicative of gain, is equal to −(RF1/RS) until the output voltage reaches either $V_1$ or $V_2$, at which time the feedback resistance RF2 effectively shunts the feedback resistance RF1. Following the breakpoint 21 or 22 the slope of the 01 curve changes to $$-\frac{RF1||RF2}{RS},$$

where the symbol || means "in parallel with". When the 01 output voltage reaches either the breakpoint 23 or 24 ($V_{out} = V_3$ or $V_4$) the slope changes once again to $$-\frac{RF1||RF2||RF3}{RS}.$$

The 02 transfer curve is zero to breakpoint 21 or 22; during this period the transistors Q5 and Q6 are back-biased and the output therefrom (02) is zero. At breakpoints 21 and 22 the transistors Q5 and Q6 conduct and the 02 transfer curve has a slope of $$-\frac{RF1||RF2}{RS},$$

which of course is the same as the 01 curve at this time. At breakpoints 23 and 24 the feedback resistance RF3 is added (in parallel) into the feedback path and the slope of the 02 curve then becomes $$-\frac{RF1||RF2||RF3}{RS},$$

which again is the same as that of the 01 curve.

The 03 transfer curve is zero until breakpoints 23 and 24 are reached, the transistors Q7 and Q8 being cut-off during this time. At breakpoints 23 and 24 the transistors Q7 and Q8 conduct and the 03 transfer curve has a slope of $$-\frac{RF1||RF2||RF3}{RS},$$

which is the same as the 01 curve at this time.

Additional switchable outputs (04, 05, ...) can be provided by the further addition of complementary pairs of transistors and feedback resistances, in the same manner as described above. The 02 and 03 outputs should preferably be coupled to utilization circuitry via a high input impedance.

The transistor types shown in the schematic drawing are merely by way of illustration, it being clear to those in the art that p-n-p transistors can generally be substituted for n-p-n transistors and vice versa with due regard, of course, to the polarities of the reference source(s). Further, the amplifier circuit in accordance with the invention can be readily fabricated in integrated circuit form. It is to be understood therefore that the foregoing disclosure relates to only a preferred embodiment of the invention and that numerous modifications or alterations may be made therein without departing from the spirit and scope of the invention.

What is claimed is:

1. An operational amplifier comprising a first pair of complementary type transistors having their emitter-collector paths connected in series across a source of reference potential, the emitters of said transistors being connected to each other and to an output terminal, means for coupling a feedback resistance from the output terminal to the input of the amplifier, a second pair of complementary type transistors being similarly connected across said reference potential, the emitters of said second pair being connected together and to a second output terminal, means for coupling a second feedback resistance from said second output to the input of the amplifier, a pair of resistors of predetermined values, each resistor being respectively connected between the base electrodes of similar type transistors of said first and second pairs, and a pair of constant current sources respectively coupled to the base electrodes of said second pair of transistors, said second pair of transistors being reverse biased until the output voltage from said first pair of transistors equal or exceeds the voltage drop across at least one of said resistors at which time the second feedback resistance effectively shunts the first-mentioned feedback resistance.

2. An operational amplifier as defined in claim 1 wherein the transistors of said second pair closely match the similar type transistors of said first pair.

3. An operational amplifier as defined in claim 2 wherein the pair of base connected resistors are of the same resistance value.

4. An operational amplifier as defined in claim 2 wherein the pair of base connected resistors are of different resistance values.

5. An operational amplifier as defined in claim 2 including a third pair of complementary type transistors being similarly connected across said reference potential, the emitters of said third pair being connected together and to a third output terminal, means for coupling a third feedback resistance from said third output to the input of the amplifier, another pair of resistors of predetermined values, each of the latter resistors being respectively connected between the base electrodes of similar type transistors of said second and third pairs, said pair of constant current sources being respectively and directly connected to the base electrodes of said third pair of transistors.

6. An operational amplifier as defined in claim 5 wherein the transistors of said third pair closely match the similar type transistors of said first and second pair.

7. An operational amplifier comprising a first pair of opposite conductivity type transistors having their emitter-collector paths connected in series, the emitters of said transistors being connected together and to an output terminal, a feedback resistance, means for coupling said feedback resistance from the output terminal to the input of the amplifier, a second pair of opposite conductivity type transistors being interconnected in the same manner as said first pair of transistors, the emitters of said second pair being connected together and to a second output terminal, a second feedback resistance, means for coupling said second feedback resistance from said second output to the input of the amplifier, a pair of resistors of predetermined values, each resistor being respectively connected between the base electrodes of similar type transistors of said first and second pairs, and a pair constant current source circuits respectively coupled to the base electrodes of said second pair of transistors, the transistors of said second pair being matched to the similar type transistors of said first pair.

* * * * *